(12) United States Patent
Yim et al.

(10) Patent No.: US 12,354,557 B2
(45) Date of Patent: Jul. 8, 2025

(54) THIN FILM TRANSISTORS FOR CIRCUITS FOR USE IN DISPLAY DEVICES

(71) Applicant: Applied Materials, Inc., Santa Clara, CA (US)

(72) Inventors: Dong Kil Yim, Pleasanton, CA (US); Soo Young Choi, Fremont, CA (US); Jung Bae Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/556,460

(22) PCT Filed: May 7, 2021

(86) PCT No.: PCT/US2021/031364
§ 371 (c)(1),
(2) Date: Oct. 20, 2023

(87) PCT Pub. No.: WO2022/235273
PCT Pub. Date: Nov. 10, 2022

(65) Prior Publication Data
US 2024/0194152 A1   Jun. 13, 2024

(51) Int. Cl.
*G09G 3/3266* (2016.01)
*H01L 29/786* (2006.01)
*H10D 30/67* (2025.01)

(52) U.S. Cl.
CPC ....... *G09G 3/3266* (2013.01); *H10D 30/6755* (2025.01); *H10D 30/6757* (2025.01); *G09G 2300/0417* (2013.01); *G09G 2320/0214* (2013.01)

(58) Field of Classification Search
CPC ......... G09G 3/3266; G09G 2300/0417; G09G 2320/0214; H01L 29/7869; H01L 29/78696
USPC ....................................................... 345/204
See application file for complete search history.

(56) References Cited

U.S. PATENT DOCUMENTS

| 2017/0338248 A1* | 11/2017 | Park ................. H01L 29/66969 |
| 2019/0148558 A1 | 5/2019 | Suzuki et al. |
| 2020/0243571 A1* | 7/2020 | Chung ................ H01L 27/1248 |
| 2021/0020662 A1* | 1/2021 | Ishida ................... G09G 3/3258 |
| 2021/0090484 A1* | 3/2021 | Shang .................. G09G 3/3266 |

(Continued)

FOREIGN PATENT DOCUMENTS

| JP | 2017120908 A | 7/2017 |
| KR | 20190073111 A | 6/2019 |
| KR | 20200043568 A | 4/2020 |

(Continued)

OTHER PUBLICATIONS

International Search Report and Written Opinion for PCT/US2021/031364 dated Feb. 3, 2022.

(Continued)

*Primary Examiner* — Mark Edwards
(74) *Attorney, Agent, or Firm* — Patterson + Sheridan, LLP

(57) ABSTRACT

Disclosed herein is a device including a driving thin film transistor. The driving thin film transistor includes a metal oxide channel, a source electrode in contact with the driving metal oxide channel, and a top gate electrode disposed above the metal oxide channel and physically connected to the driving source electrode.

20 Claims, 15 Drawing Sheets

(56) References Cited

U.S. PATENT DOCUMENTS

2021/0280719 A1\* 9/2021 Kim .................. H01L 29/78696
2023/0062926 A1 3/2023 Oh et al.

FOREIGN PATENT DOCUMENTS

KR 20200071433 A 6/2020
WO WO-2020059027 A1 \* 3/2020 ......... H01L 27/3262

OTHER PUBLICATIONS

Korean Office Action dated Aug. 12, 2024 re: Korean Patent Application No. 2024-067271915.
Korean Office Action Dated Mar. 25, 2025 re Korean Application No. 10-2023-7042026.
JapaneseOffice Action dated February Feb. 18, 2025 re: Japanese Patent Application No. 2023-568456.

\* cited by examiner

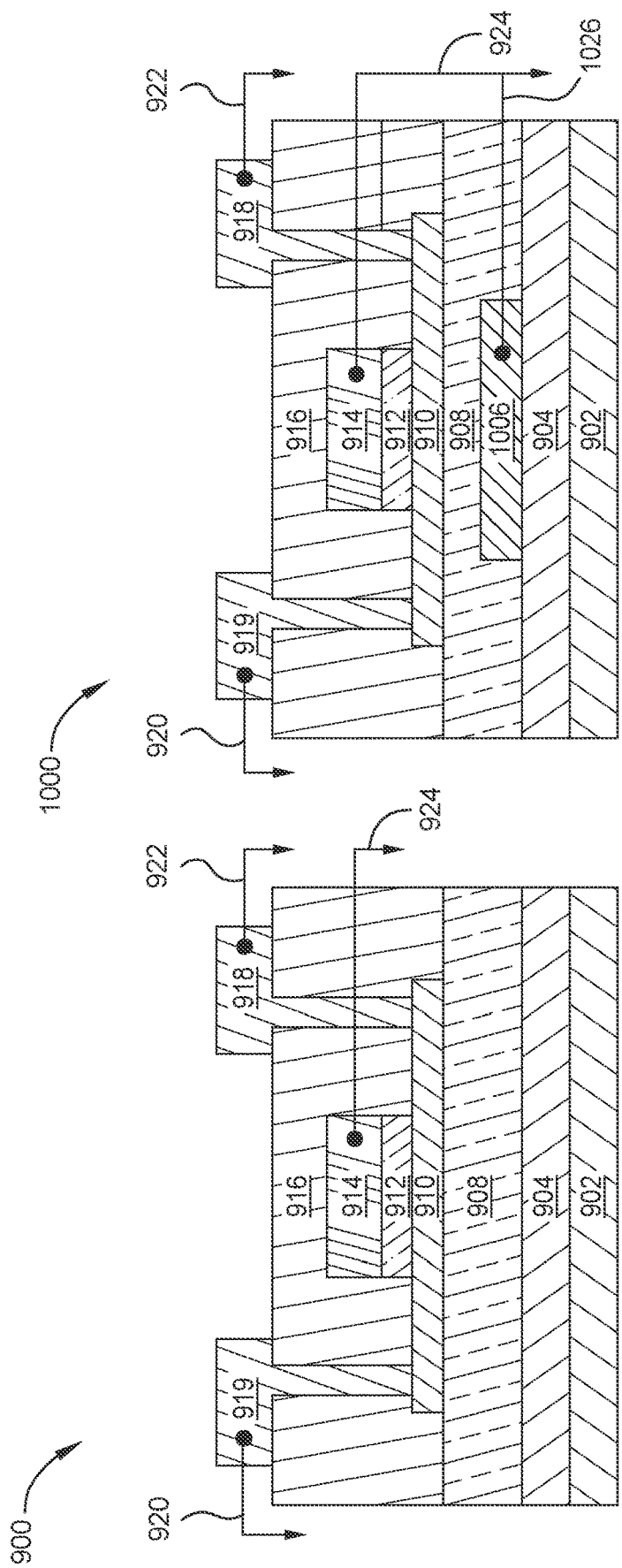

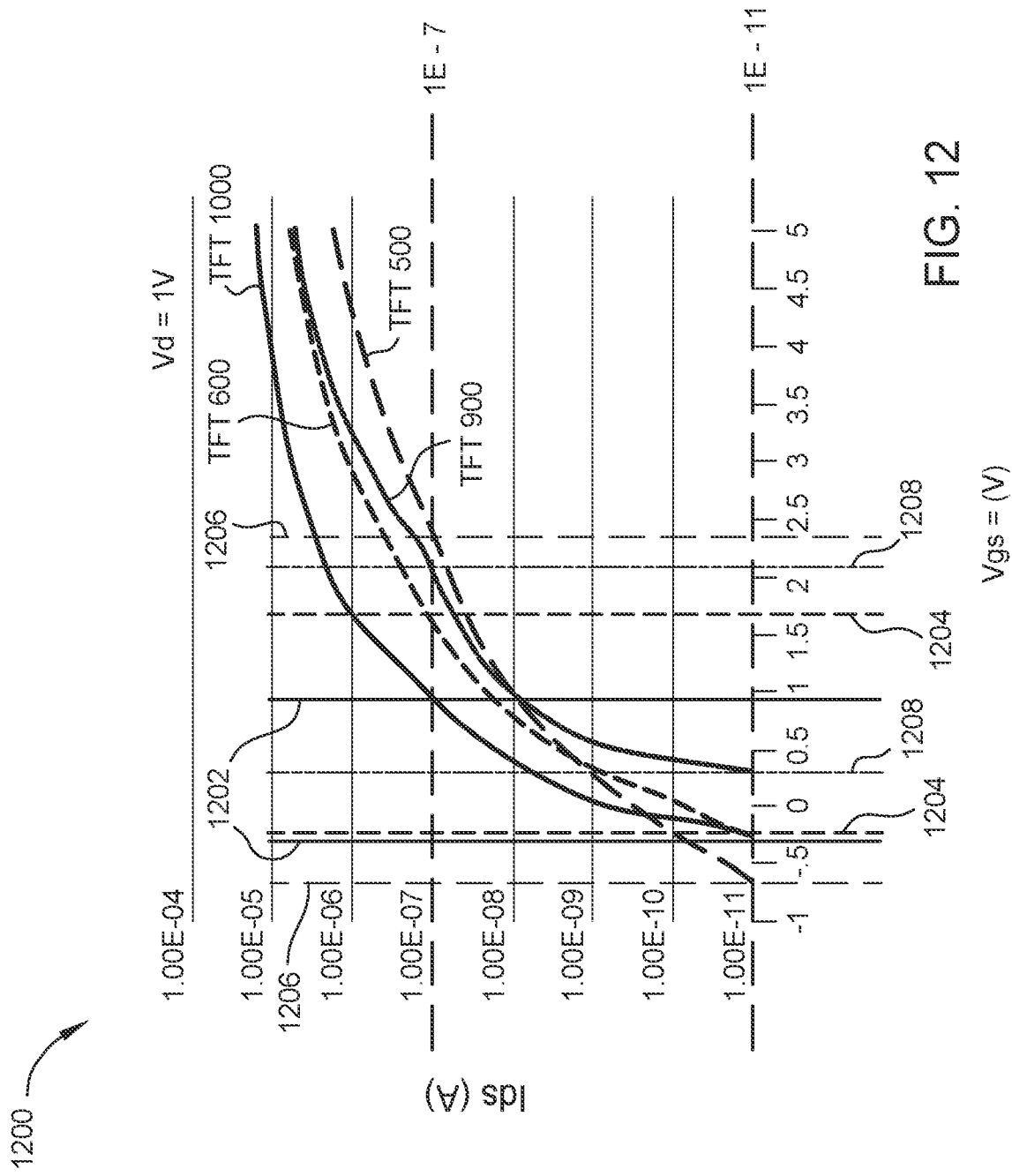

THIN FILM TRANSISTORS FOR CIRCUITS FOR USE IN DISPLAY DEVICES

BACKGROUND

Field

The present disclosure generally relates to devices having a driving thin film transistor (TFT) and/or a switching TFT used for gate (scan) driver on array (GOA) circuits and/or pixel circuits. The devices may be used in a display screen such as an organic light emitting diode (OLED) display screen.

Description of the Related Art

A thin-film transistor (TFT) is made by depositing thin films of an active semiconductor layer, as well as a dielectric layer and metallic contacts, over a supporting substrate, such as glass. In particular, a TFT can be a metal-oxide-semiconductor field-effect transistor (MOSFET).

TFTs have gained significant interest in display applications due to their high resolution, low power consumption, and high speed operation for liquid crystal displays (LCDs) and organic light-emitting diode (OLED) displays. TFTs are embedded within a panel of the display. Data line voltage signals from source driver ICs in display module and scan line voltage signals from gate driver circuits in peripheral display panel area in the display panel are delivered to TFTs in pixel circuits to control display images by turning on and off the TFTs in active display panel area. Image distortion is decreased by improving the response of the TFT with higher mobility and/or by reducing crosstalk between pixels. Most display products including LCD or OLED televisions (TVs) and monitors include TFTs in the panel. Many modern high-resolution and high-quality electronic visual display devices use active matrix based OLED displays with a large number of TFTs as components of pixel circuits. One beneficial aspect of TFT technology is its use of a separate TFT for each pixel on the display. Each TFT works as a switch or a source of current in the pixel circuit or gate driver circuit by controlling voltage and current through data and gate signal lines for increased control of display images. Higher on current from a high mobility TFT allows fast refresh of the display images and better image qualities by minimizing the distortion of data and gate signal voltages.

One drawback of conventional TFTs for OLED display panel is that they can have limitations on the stability, voltage control for color and/or gray scale, high sensitivity with drain voltage from driving TFT as a component of pixel circuit for the control of OLED current control due to the OLED uniformity changes due to the on-current variations in driving TFT during display operation, and slow speed of response in switching TFTs as a component of pixel circuit, especially for high resolution and/or large screen displays.

Therefore, what is needed are improved switching and driving TFTs for pixel circuits and improved switching TFTs for gate driver circuits with low off leakage current.

SUMMARY

Disclosed herein is a device having a driving thin film transistor (TFT), the driving TFT including a driving channel. A driving source electrode is electrically connected with the driving channel and a driving top gate electrode disposed above the driving channel and electrically connected to the driving source electrode.

In some embodiments, device is provided having a driving thin film transistor (TFT) including a first TFT. The first TFT includes a first channel, and a first bottom gate electrode disposed below the first channel. A second TFT is provided having a second channel, and a second bottom gate electrode disposed below the second channel and electrically connected to the first bottom gate electrode of the first TFT.

In some embodiments, a device is provided having a driving thin film transistor (TFT). The driving TFT including a first TFT. The first TFT includes a first channel, and a first top gate electrode disposed above the first channel. The driving TFT includes a second TFT including a second channel, and a second top gate electrode disposed above the second channel and electrically connected to the first top gate electrode of the first TFT.

In some embodiments, a device is provided having a driving thin film transistor (TFT). The driving TFT includes a first TFT with a first channel, and a first top gate electrode disposed above the first channel. The driving TFT includes a second TFT having a second channel, and a second top gate electrode disposed above the second channel and electrically connected to the first top gate electrode of the first TFT.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIG. 9 depicts a switching transistor for pixel and/or GOA circuits, in accordance with some embodiments.

FIG. 10 depicts a switching transistor for pixel and/or GOA circuits, in accordance with some embodiments.

FIG. 12 depicts a graphical illustration of drain source current over gate voltage behavior comparison of transistors, in accordance with some embodiments.

Figure 1:
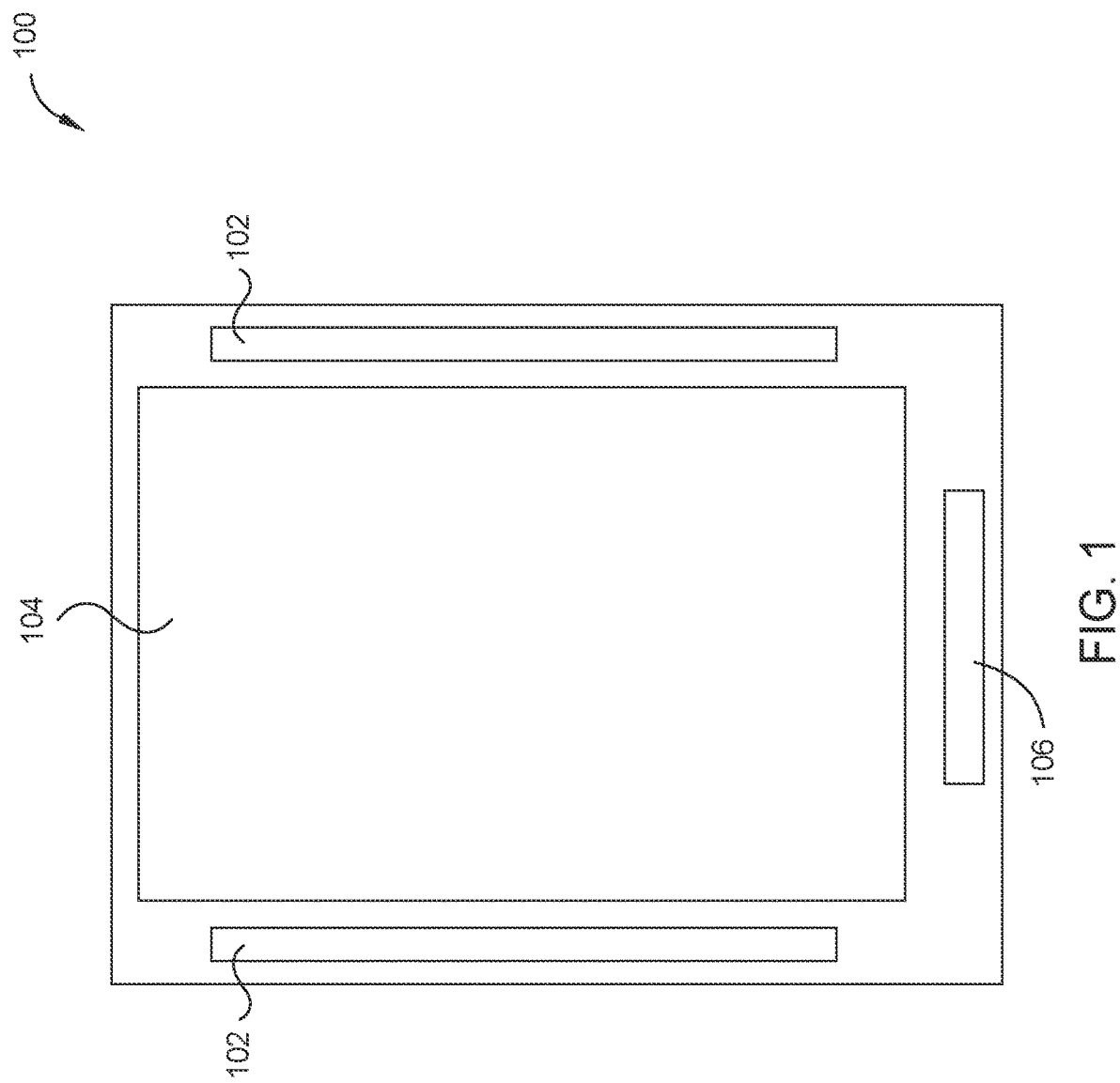
FIG. 1 is a schematic of a simplified organic light emitting diode display (OLED) panel in accordance with some embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

Embodiments herein include thin-film transistors (TFTs) used in circuits for devices, such as display devices. The TFTs disclosed herein transport high current with high stability, good control, and fast response of the TFTs due to higher on current in the TFTs, and selection of electrodes to apply biasing in combination with selection of electrodes to connect for each circuit. The TFTs described herein can be used as driving TFTs for pixel circuits as well as switching TFTs for gate driver on array (GOA) circuits and pixel circuits. One or more of the TFTs include a gate structure disposed over a high carrier density metal oxide channel. The gate structure includes one or more gate electrodes, and thus the TFTs are top-gate (TG), double-gate (DG), or bottom-gate (BG) TFTs. The TFTs described herein are particularly useful for double-gate structures. The channel can include one or more layers of differing electron mobilities contributing different benefits to each TFT. In particular, high mobility layers of the channel increases the speed of response of the TFTs, and low mobility layers allow more positive threshold voltage (turn on voltage) and lower leakage current than a high mobility layer in the same TFTs. The combination of the low mobility layer and the high mobility layer results in TFTs with improved qualities such as improved mobility, lower off leakage current, and positive threshold voltage (turn on voltage), as described herein.

In order to operate a sub-pixel of an OLED pixel for a display, at least one switching transistor, one driving transistor, and one capacitor are used. The switching TFT passes data voltage to the capacitor (storage). The storage capacitor is connected to a gate for a driving TFT. The gate voltage of the driving TFT connected to the storage capacitance determines how much current of the driving TFT is flowing to the OLED to control brightness. The required capacitance of the storage capacitor is determined by the frame rate and the leakage current of the switching TFT connected to both the storage capacitor and the gate of the driving TFT for the display.

FIG. 1 is a schematic of a simplified organic light emitting diode display (OLED) panel 100. The OLED panel 100 includes a non-display area 102 of switching TFTs for a gate driver on array (GOA) circuit, a display area 104 of switching and driving TFTs for pixel circuit, and an area 106 of source (data) driver integrated circuits. In some aspects, the non-display area 102 is disposed in an edge region disposed at one or more sides, or surrounding the display area 104.

Figure 2:
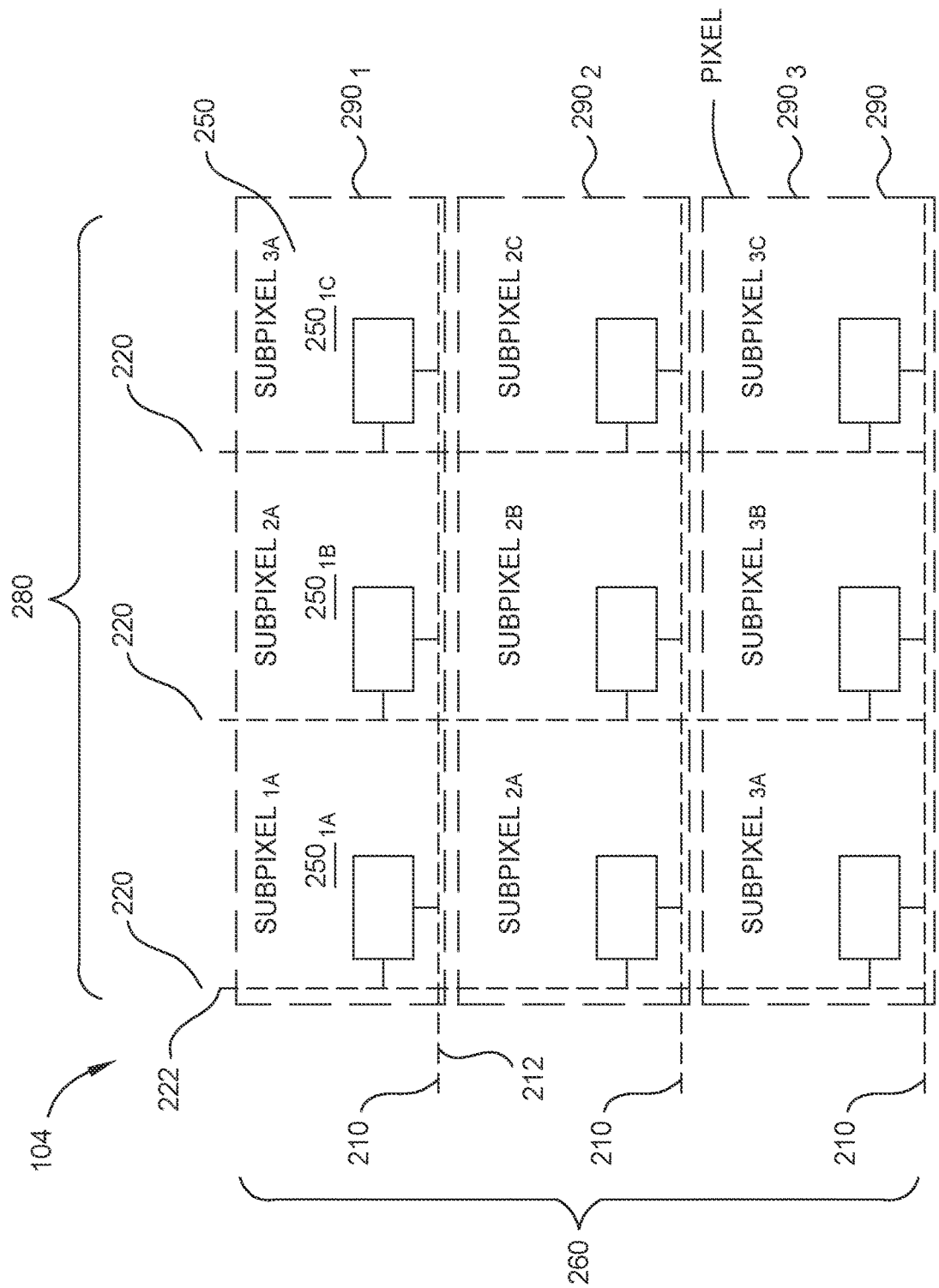
FIG. 2 is a schematic of an active matrix pixel array in a display area of an OLED panel in accordance with some embodiments.

FIG. 2 is a schematic of an active matrix pixel array in the display area 104 of an OLED panel 100. The display area 104 has an array of pixels 290, i.e., a first pixel 2901, a second pixel 2902, a third pixel 2903, etc., arranged in rows 260 and columns 280. Each pixel 290 has a plurality of sub-pixels 250 for determining a value of the pixel 290. For example, a first pixel 2901 has a first sub-pixel 2501A, a second sub-pixel 2501B and a third sub-pixel 2501c. Each sub-pixel 250 being a single color element of a respective pixel 290. However, the first pixel 2901 may have more than three sub-pixels 250, for example, a sub-pixel 2501N wherein '1N' can represent any number of sub-pixels 250 for the first pixel 2901. Each row 260 in the OLED panel 100 can be accessed independently using scan lines 210. Each column 280 in the OLED panel 100 can be accessed using data lines 220. Addressing a first scan line 212 and a first data line 222 accesses the first sub-pixel 2501A in the first pixel 2901 of the OLED panel 100. Each sub-pixel 250 may be similarly addressed in the OLED panel 100. In various embodiments, while each sub-pixel 250 is illustrated as being coupled to a single scan line 210, each sub-pixel may be coupled to a plurality of scan lines 210 that may be used to control updating each sub-pixel 250. In such embodiments, the scan lines 210 may be driven at different times with different select signals to control the update timing of the sub-pixels 250.

In one or more embodiments, the OLED panel 100 may be an organic light emitting diode (OLED) display device. In such an embodiment, each of the sub-pixels 250 may comprise an electrode that is coupled to a corresponding scan line (or lines) and a data line via one or more transistors. A sub-pixel data signal (or signals) is applied to a switching TFT to deliver data signal to a driving TFT with a specified voltage level when the switching TFT is turned on. The driving TFT are connected to OLED and the current from the driving TFT controls the brightness of OLED in OLED display panel. The supply voltages, ELVDD or VSS, are applied to each sub-pixel to control gray scale color and brightness of OLED by controlling the current in driving TFT in each pixels. In one embodiment, a positive supply voltage may be referred to as ELVDD and a negative supply voltage may be referred to as VSS or ELVSS.

Figure 3:
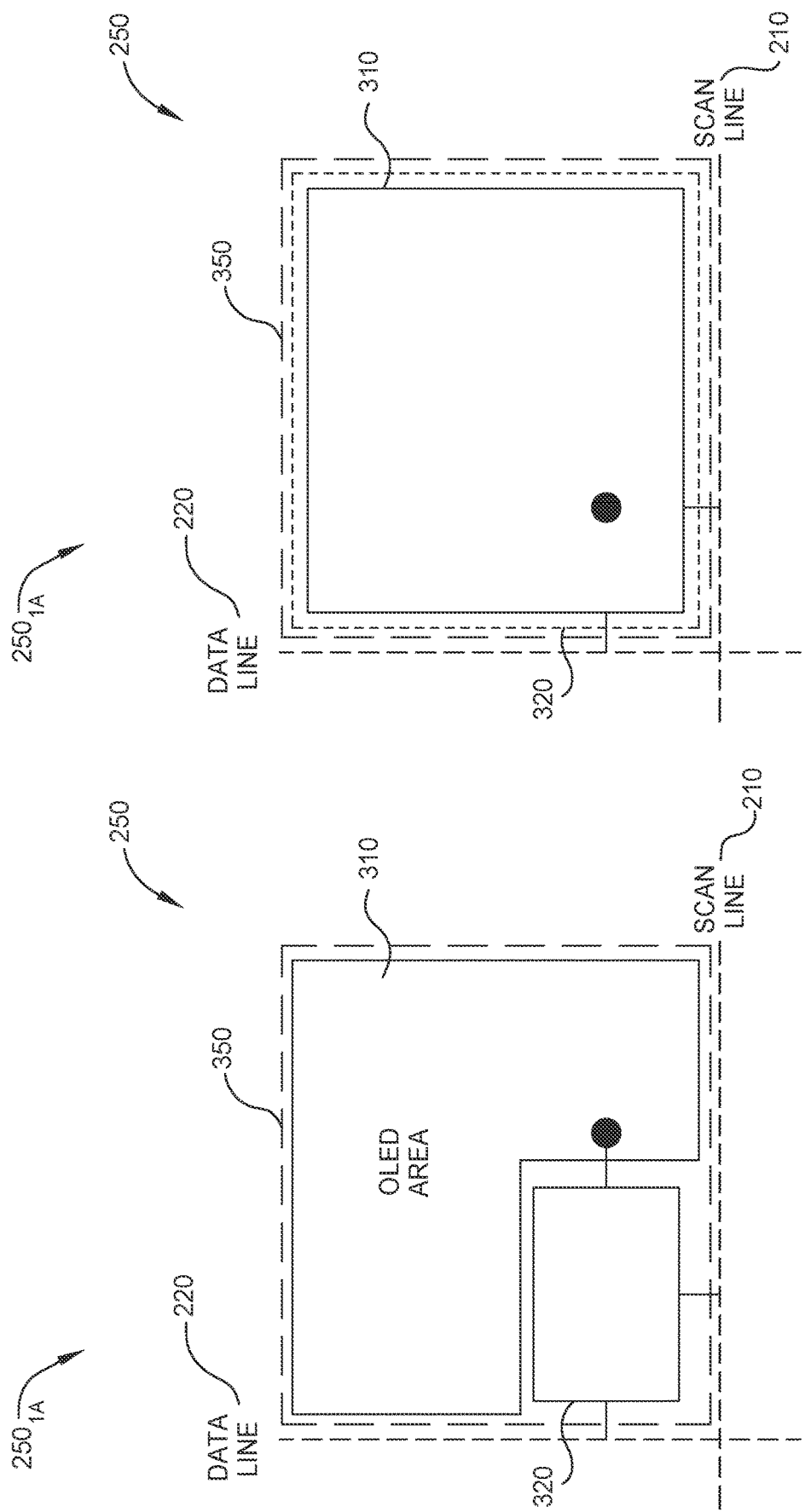
FIG. 3A depicts a schematic illustration of a bottom emission OLED display, in accordance with some embodiments.
FIG. 3B depicts a schematic illustration with a top emission OLED display, in accordance with some embodiments.

FIG. 3A shows a schematic illustration with a bottom emission OLED display. An OLED is positioned on the top of a sub-pixel circuit 320. Light from the OLED cannot pass through the sub-pixel circuit area 320 due to the direction of light emission, downward. The single sub-pixel 250 may be the first sub-pixel 2501A. However, the single sub-pixel 250 shown in FIG. 3A is generic to each of the sub-pixels 250, such as the first sub-pixel 2501A, and further discussion will be with regard to the generic sub-pixel 250. The sub-pixel 250 has a sub-pixel area 350. A portion of the sub-pixel area 350 is occupied by an OLED area 310. The OLED area 310 is the light-emitting element of the sub-pixel 250. The OLED area 310 is a current driven light-emitting device. The remaining portion of the sub-pixel area 350 is occupied by the sub-pixel circuit 320 that has one or more transistors, capacitors and metal routing connecting the transistors and capacitors for forming the sub-pixel circuit 320. The one or more transistors, capacitors and metal routing may be disposed within a different metal layer of a substrate (device) than another one of the transistors, capacitors and metal routing in forming the sub-pixel circuit 320. The sub-pixel circuit 320 controls the OLED area 310 providing the power needed to drive the sub-pixel 250, i.e., to emit or not emit light.

FIG. 3B shows a schematic illustration with a top emission OLED display. For the top emission OLED display, the OLED is positioned on the top of the sub-pixel circuit 320. The direction of light from the OLED is upward, so the sub-pixel circuits 320 do not block the light. Therefore, the area of the sub-pixel circuits 320 from top emission OLED display can be comparable with the OLED area 310, which allows higher density than the bottom emission OLED display.

Figure 4:
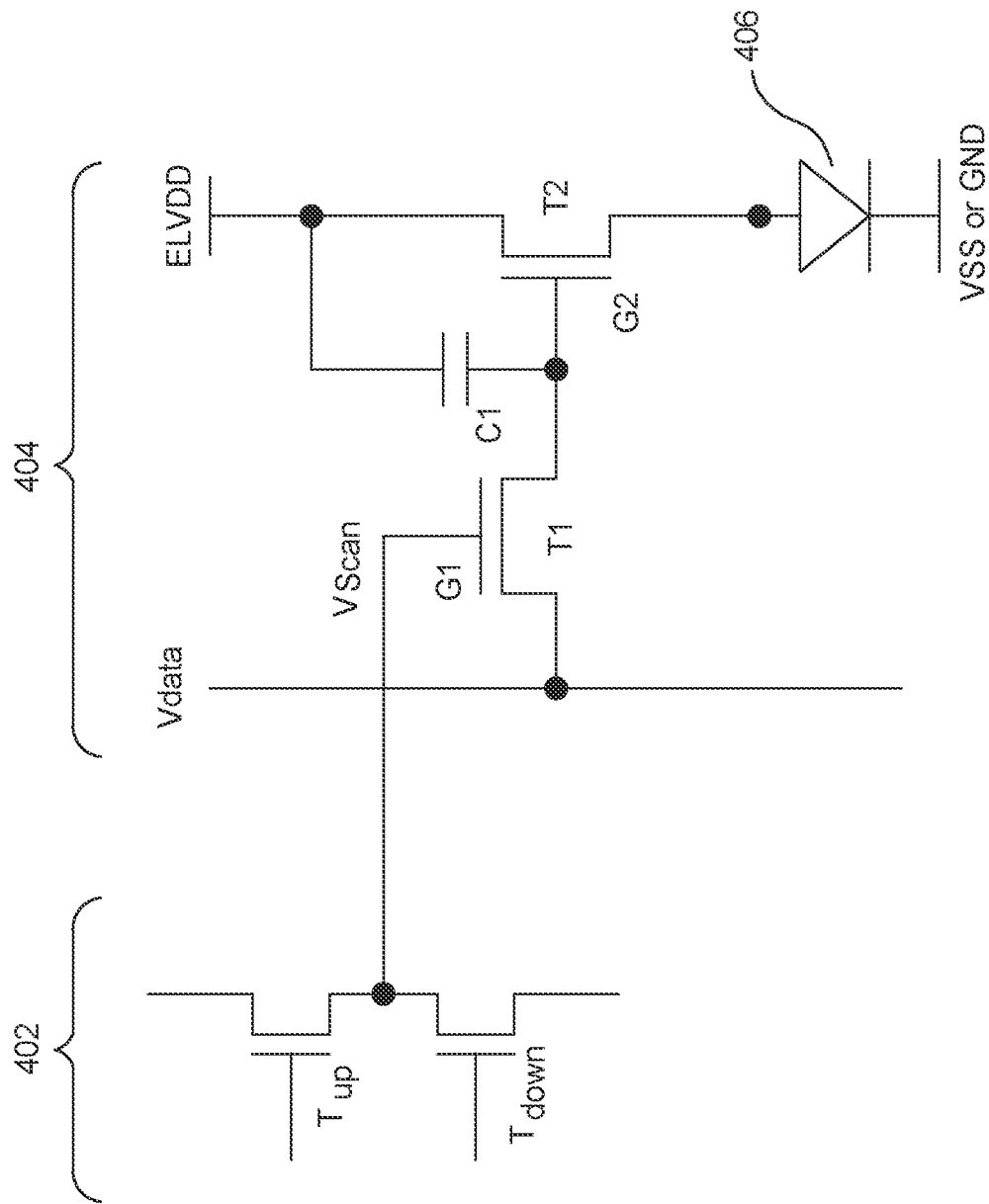
FIG. 4 is a schematic illustration of a simplified set of pixel circuits and GOA circuits in an OLED display panel, in accordance with some embodiments.

FIG. 4 is a schematic illustration of a simplified set of pixel circuits 404 and GOA circuits 402 in an OLED display panel 100, according to one or more embodiments. Each set of pixel 404 and GOA circuits 402 has a plurality of thin-film transistors (TFTs) and a storage capacitor, such as more than two transistors and/or more than one capacitor. Generally, a pixel circuit 404, such as sub-pixel circuit 320, includes a switching transistor T1, a current regulator or a driving transistor T2, and a storage capacitor C1. A GOA circuit 402 includes switching transistors, such as a pull up buffer switching transistor $T_{DOWN}$ and a pull down buffer switching transistor $T_{UP}$. The transistors for GOA circuits and pixel circuits can be oxide transistor or low-temperature polycrystalline silicon (LTPS) transistor.

A switching transistor gate (G1) is connected to scan line (Vscan) and a source-drain is connected between Vdata line and a gate (G2) of the driving transistor T2. An OLED 406, disposed in the OLED area 310 of the sub-pixel 250 pixel in a full-color display, is electrically connected to the driving transistor T2. The circuit for the OLED 406 continues further to a low level supply voltage (VSS) or ground (GND). The OLED 406 is controlled by the pixel circuit 320 and has the cathode connected to the common terminal or conductor and the anode connected through the source-drain of the driving transistor T2 to a high level power supply (ELVDD). The storage capacitor C1 holds the gate voltage of the driving transistor T2. Other locations of the storage capacitor C1 is also contemplated.

When a select signal appears on Vscan line and a data signal appears on Vdata line, the OLED is addressed or selected. The transistors may be turned on and off by applying a select signal to the gate of the transistor via the selected line. The signal on the Vscan line is applied to the gate (G1) of switching transistor T1, turning "ON" the transistor. The data signal on Vdata line is applied through the source-drain of switching transistor T1 to the gate (G2) of driving transistor T2, turning the driving transistor T2 "ON" according to the amplitude and/or duration of the data signal. The driving transistor T2 then supplies power, generally in the form of driving current, to the OLED 406, the brightness or intensity of light generated by OLED 406 may depend upon the amount and/or duration of current supplied. The storage capacitor C1 memorizes the voltage on the Vdata line after switching transistor T1 is turned "OFF".

Figures 5A, 5B:
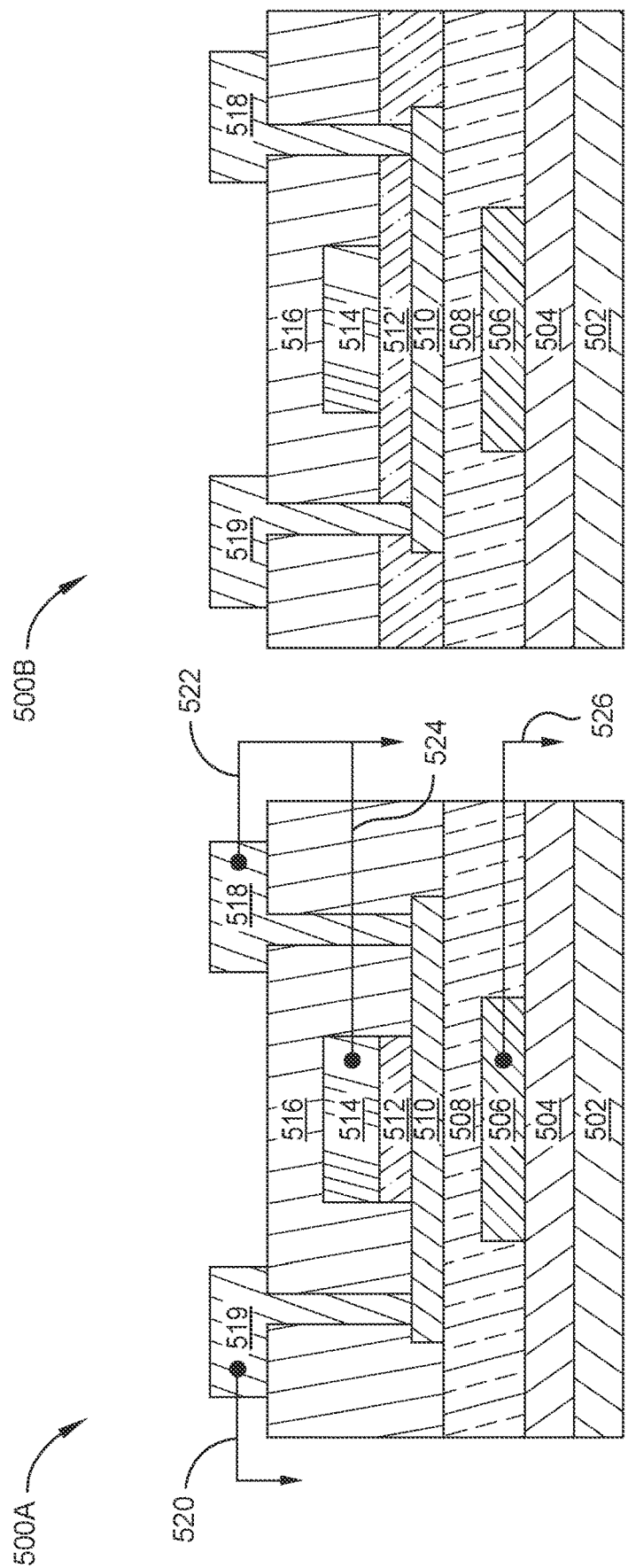
FIG. 5 depicts a driving transistor for pixel circuits, in accordance with some embodiments.
Figure 6:
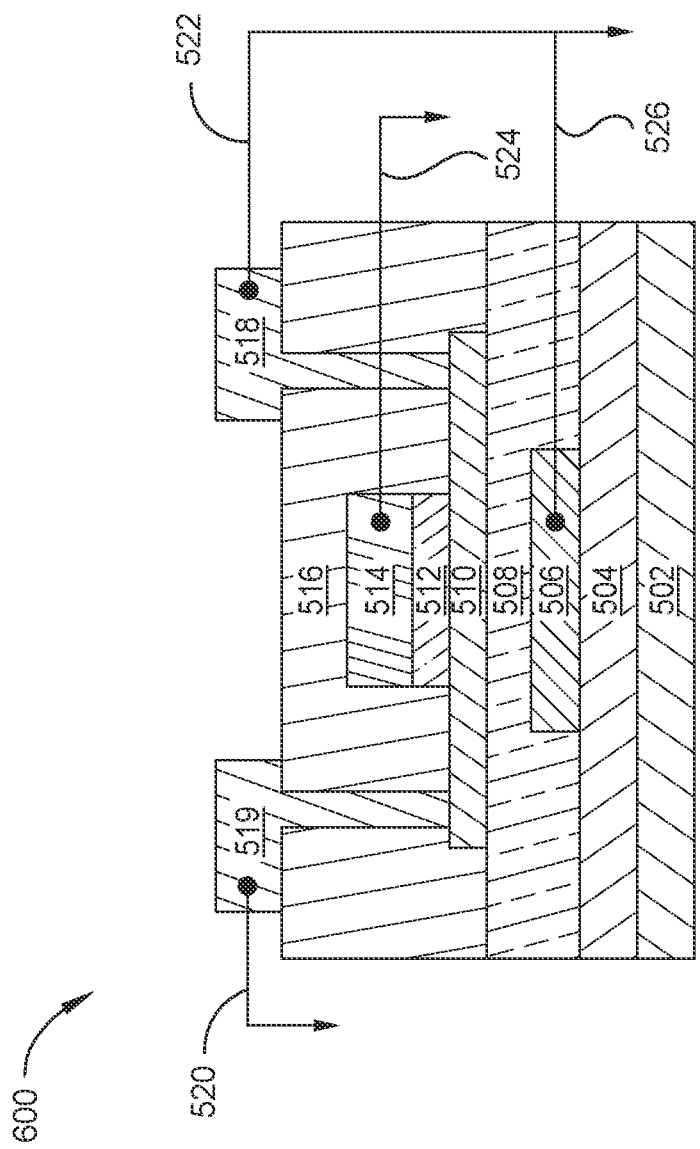
FIG. 6 depicts a driving transistor for pixel circuits, in accordance with some embodiments.

FIGS. 5A, 5B, and 6 depict schematic, cross-sectional views of various driving transistors for pixel circuits, in accordance with some aspects of the present disclosure. In some aspects, each of the driving transistors can be used as a driving transistor (T2) in a pixel circuit 404, as shown in FIG. 4.

The driving TFTs 500A, 500B of FIGS. 5A and 5B are double gate TFTs having a top gate electrode 514 and a bottom gate electrode 506. The TFT 500A, 500B includes a substrate 502, such as a silicon based substrate, an insulating based substrate, a germanium based substrate, or other suitable flexible substrate. The substrate 502 may include one or more generic layers that would be present in a complementary metal-oxide-semiconductor (CMOS) device structure. The substrate 502 can include a transparent material, such as a rigid glass or flexible polyimides (PI), which can be useful if the TFT is used in LCD or OLED display applications, such as TVs, tablets, laptops, mobile phones or other displays.

In some embodiments, a buffer layer 504 is disposed over the substrate 502, such as in direct contact with the substrate 502. The buffer layer 504 can include insulating materials such as single silicon dioxide ($SiO_x$), silicon nitride ($SiN_x$), multi-layer silicon nitride/silicon oxide ($SiN_x/SiO_y$), silicon oxynitride (SiON), other insulating materials, or combinations thereof. The bottom gate electrode 506 is disposed over the buffer layer 504. In some aspects, the bottom gate electrode 506 corresponds to G2 of FIG. 4. In some embodiments, a gate bias is applied to the bottom gate electrode 506 during use in an OLED application. In some aspects the bottom gate electrode is deposited and patterned using any suitable process known in the industry. A bottom gate insulating (GI) layer 508 is disposed over and surrounds the bottom gate electrode 506. The GI material for the bottom gate insulator and/or for any gate insulators described herein can include insulating materials such as silicon, $SiN_x$, other insulating materials, or combinations thereof, such as silicon di-oxide ($SiO_2$), polymethylsilsesquioxane (PMSQ) or other suitable material.

A channel structure 510 is disposed over the bottom GI layer 508. The channel structure 510 can be a single layer channel structure, a double layer channel stack with each layer having different electron mobility, or three or more layers, each layer having different electron mobility than layers disposed immediately above or below the layer. The channel structure 510 is composed of a metal oxide material, or low temperature poly silicon (LTPS). Any of the channel structures described herein can be composed of a metal oxide (MO) material, such a single or multi-layer MO channel. Alternatively, any of the channel structures described herein can be composed of LTPS, such as a single layer LTPS channel. The metal oxide can include oxygen (O), indium (In), gallium (Ga), zinc (Zn), tin (Sn), aluminum (Al), and combination(s) thereof, such as In—Zn—O, In—Ga—O, In—Sn—O, In—Ga—Zn—O, In—Zn—Sn—O, In—Ga—Sn—O, In—Ga—Zn—Sn—O, or any combination(s) thereof. The metal oxide materials or LTPS can be selected based on a predetermined electron mobility selected for one or more layer of the channel structure 510. A top gate insulating (GI) layer 512 is disposed over the channel structure 510. In some embodiments, the top GI layer 512 is patterned to approximate a width of the top gate electrode 514 disposed above the top GI layer 512. Alternatively, the top GI layer 512' is disposed over and surrounds the channel structure 510 and is disposed over the bottom GI layer 508, as shown in FIG. 5B. Although all of the TFTs depicted in the figures illustrate a top GI layer 512 similar to FIG. 5A, the top GI layer 512' shown in FIG. 5B, or any other patterning which includes a top GI layer with a greater width than the top gate electrode, can be used in one or more of the TFTs depicted in any of the other Figures.

An inter layer dielectric (ILD) layer 516 is disposed over the top gate electrode 514 and a portion of the channel structure 510. Any ILD layer described herein may be composed of a material such as silicon oxides, nitrides, oxynitrides, and carbides such as silicon-based dielectric films.

The driving TFT 500A includes a source 518 and a drain 519 disposed over the ILD layer 516. The source 518 and drain 519 are coupled to vias in the ILD layer 516 to the channel structure 510. Each electrode described herein (e.g., top gate electrode 514, bottom gate electrode 506, source/drain electrodes 518, 519) include conductive materials such as molybdenum (Mo), chromium (Cr), copper (Cu), titanium (Ti), tantalum (Ta), tungsten (W), alloy metals including MoW, combinations of conductive materials including MoW, TiCu, MoCu, MoCuMo, TiCuTi, MoWCu, MoWCu-MoW, any electrically conductive materials, such as including conductive metal oxides, such as indium tin oxide (InSnO) [ITO] and indium zinc oxide (InZnO) [IZO], or any combination thereof.

In each of the Figures, each electrode of the TFTs include electrode paths in which the current path for each electrode is depicted. For example, TFT 500A includes a drain electrode path 520 coupled to drain voltage, source electrode path 522 coupled to source voltage, top gate electrode path 524 coupled to the source electrode and the source voltage, and bottom gate electrode path 526 coupled to gate voltage. The driving TFT 500A includes a physical and electrical connection between the source electrode 518 and the top gate electrode 514 by way of the electrode paths 522 and 524. In some embodiments, the connections are connected by electrical wiring and/or other connection bridges. The connection can be made using contact holes in the active pixel area (e.g., display area 104). Gate bias is applied via bottom gate electrode path 526 to the bottom gate electrode 506.

In contrast with the connections described with reference to FIG. 5A, connections between the source electrode 518 (e.g., source electrode path 522) and bottom gate electrode 506 (e.g., bottom electrode path 526) can be made for use in a driving TFT 600 depicted in FIG. 6. The source electrode path 522 and bottom electrode path 526 are connected and coupled to source voltage. Gate bias is applied to the top gate electrode 514 via path 524 coupled to gate voltage. Relative to TFT 600, it has been discovered that connecting the source electrode 518 with the top gate electrode 514 when used as a driving TFT for pixel circuits in OLED devices, enables improved stability, improved control of voltage for color and/or gray scale, and improved output saturation curves and less sensitivity with drain voltage for OLED current control. In particular, the top gate electrode 514 is substantially the same voltage as the source electrode 518 which provides improved stability.

Figure 7:
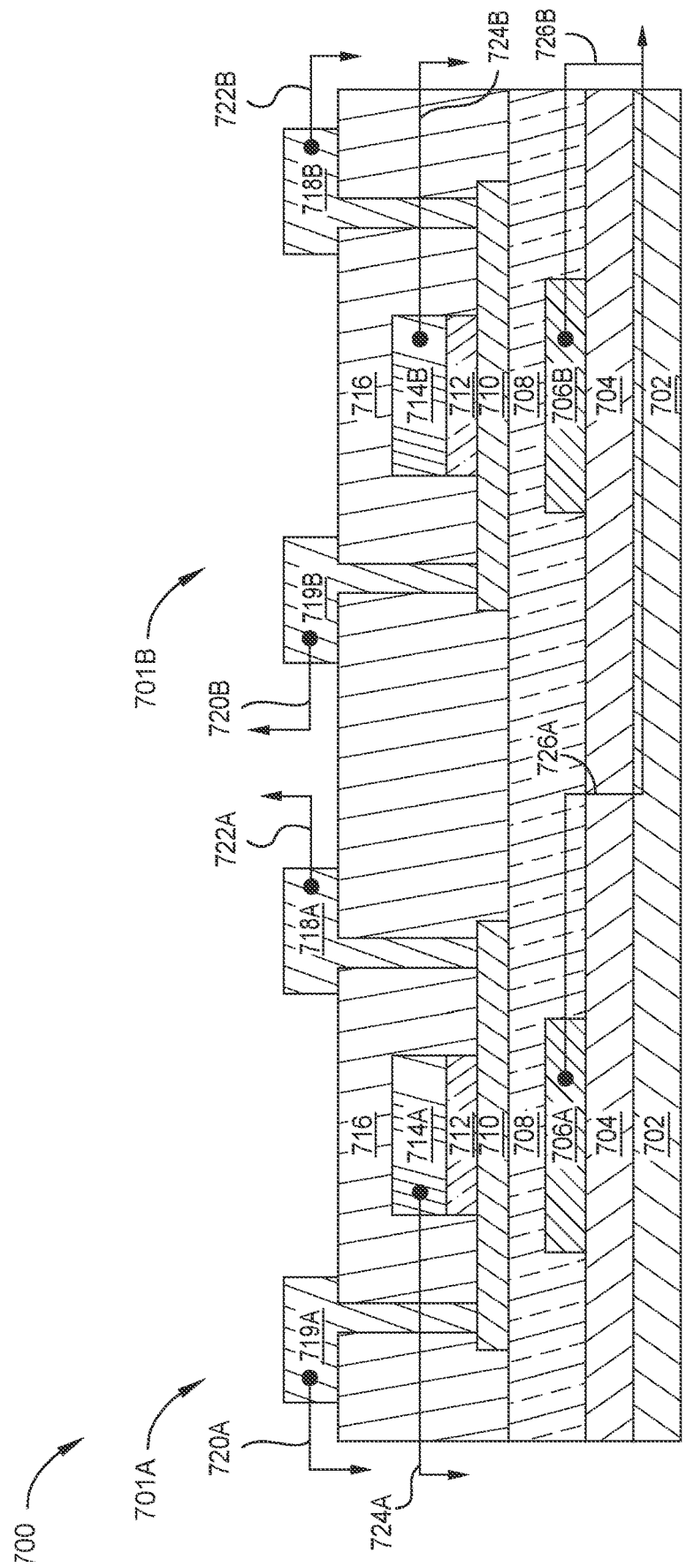
FIG. 7 depicts a driving transistor for pixel circuits, in accordance with some embodiments.

FIG. 7 depicts an example driving TFT 700 having two TFT structures from two adjacent sub-pixel circuits in the display area disposed on a substrate (TFT 701A and TFT 701B). One driving TFT is from one sub-pixel circuit and the other driving TFT is from the adjacent sub-pixel circuit. Each sub-pixel circuit has one driving TFT connected to OLED. Each TFT includes the layers described with reference to FIGS. 5A and 5B. In particular, each TFT is a double gate TFT having a buffer layer 704 disposed over a substrate 702. Each TFT includes a bottom gate electrodes 706A, 706B, bottom GI layer 708, channel structure 710, top gate insulating layer 712, top gate 714A, 714B, and ILD layer 716. Each TFT includes source electrodes 719A, 719B, and drain electrodes 718A, 718B.

The bottom electrodes 706A, 706B for each TFT 701A, 701B are connected as depicted by paths 726A and 726B and coupled to direct current (DC) voltage or ground (GND). Other paths are shown similar to those depicted in FIG. 5A (e.g., drain electrode path 720A, 720B coupled to drain voltage, source electrode paths 722A, 722B coupled to source voltage, and top gate electrode paths 724A, 724B coupled to gate voltage). In some aspects, the top gate electrodes correspond to G2 depicted in FIG. 4. It has been discovered that connecting the bottom electrodes enables tuning the threshold voltage (Vth) by changing voltage of the bottom gate electrode with a positive or a negative DC voltages. The bottom gate metals are physically connected during integration processes and a contact hole can be made to connect the top layer metal at the end of the panel to apply voltage signal. A contact hole is not necessary in the active pixel area to connect bottom gate and source electrodes. Thus, one less mask and more space are available by removing the need for a contact hole for TFT 600. Relative to TFT 600, using driving TFT 700 as a driving transistor for pixel circuits enables tuning the threshold voltage (Vth) by changing voltage of the bottom gate electrode with positive or negative DC voltages and also allows better control of voltage for color and/or gray scale, better output saturation and less sensitivity with drain voltage for OLED current control.

Figure 8:
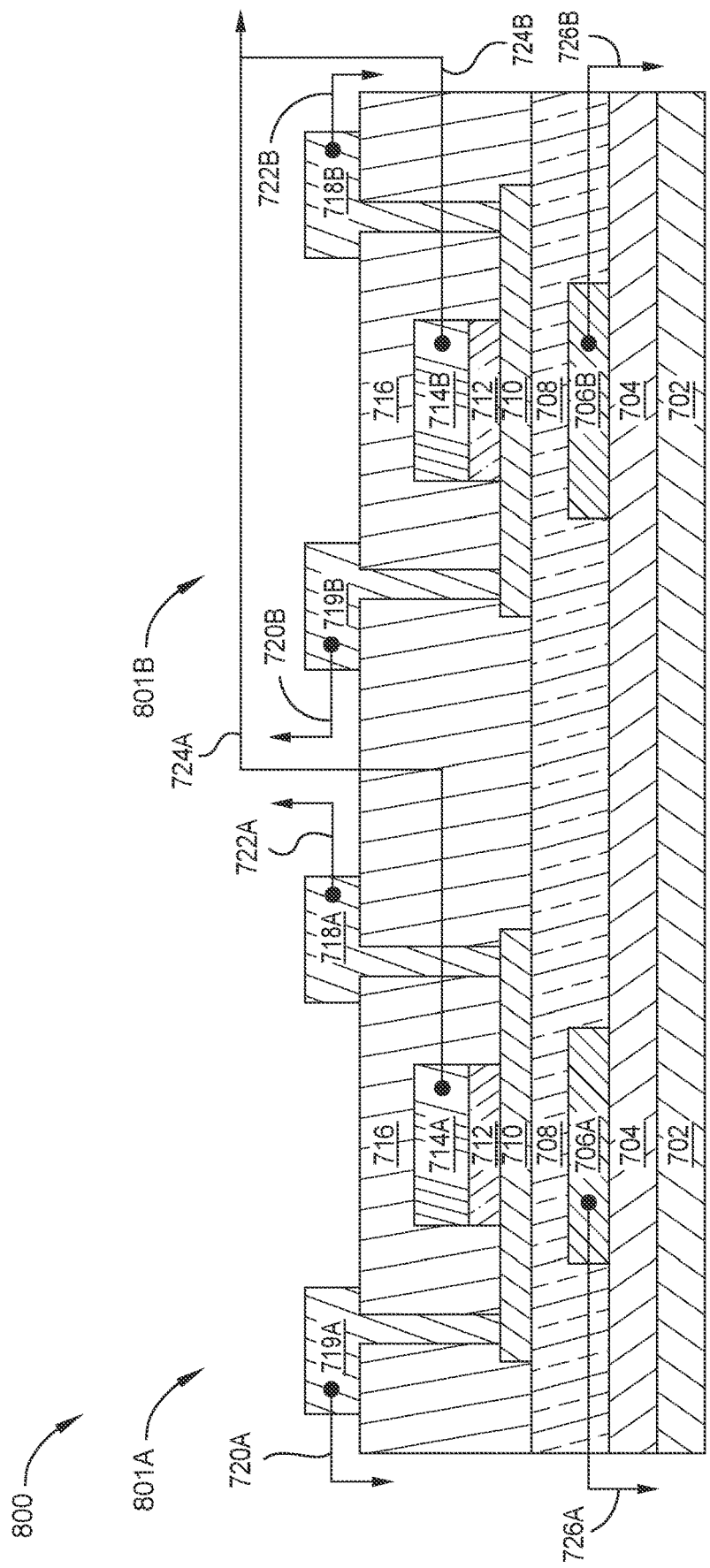
FIG. 8 depict a driving transistor for pixel circuits, in accordance with some embodiments.

FIG. 8 depicts an example driving TFT 800 having two TFT structures disposed on a substrate (TFT 801A and TFT 801B). TFT 800 is identical to TFT 700, except that the top gate electrodes 714A, 714B are connected through paths 724A and 724B and coupled to direct current (DC) voltage, and the bottom gate electrodes 706A, 706B are not connected. In some aspects, the bottom gate electrodes 706A, 706B correspond to G2 depicted in FIG. 4. Other paths are shown similar to those depicted in FIG. 7. In particular, drain electrode paths 720A, 720B are coupled to drain voltage, source electrode paths 722A, 722B are coupled to source voltage, and bottom gate electrode paths 726A, 726B are coupled to gate voltage. Threshold voltage (Vth) can be easily tuned by changing voltage of the top gate electrodes 714A, 714B. The top gate metals are physically connected during integration processes and a contact hole can be made to connect the top layer metal at the edge of the panel to apply a voltage signal. Thus, one less mask is needed to make the connection relative to TFT 500A or TFT 600. A contact hole is not necessary in the active pixel area to connect top gate and source electrodes. Relative to TFT 500A, using driving TFT 800 as a driving transistor for pixel circuits enables tuning the threshold voltage (Vth) by changing voltage of the top gate with positive or negative DC voltages and also allows better electrical stability under a positive bias temperature stress (PBTS) or a negative bias temperature stress (NBTS), better control of voltage for color and/or gray scale, and better output saturation and less sensitivity with drain voltage for OLED current control.

Each of the driving transistors described with reference to FIGS. 5A, 5B, and 6-8 can be used in combination of one or more switching transistors for a GOA circuit or pixel circuit which will be described with reference to FIGS. 9 and 10. In some aspects, each of the switching transistors can be used as a switching transistor (T1) in a pixel circuit 404 and/or switching transistor ($T_{UP}$, $T_{DOWN}$) in a GOA circuit 402, as shown in FIG. 4. Referring to FIG. 9, a switching TFT 900 is a top gate TFT without a bottom gate electrode. Switching TFT 900 includes the layers described with reference to FIGS. 5A and 5B, except a bottom gate electrode. In particular, switching TFT is a top gate TFT having a buffer layer 904 disposed over a substrate 902. A bottom insulating layer 908 is disposed over the buffer layer 904, followed by a channel structure 910, top gate insulating layer 912, top gate electrode 914, and ILD layer 916. The switching TFT 900 includes source electrode 918 with corresponding source electrode path 920 coupled to source voltage, and drain electrode 919 with corresponding drain electrode path 922 coupled to drain voltage. The top gate electrode 914 includes top gate electrode path 924 coupled to gate voltage.

Referring to FIG. 10, a switching TFT 1000 is a double gate transistor with a top gate electrode 914 and a bottom gate electrode 1006. The switching TFT 1000 is described with reference to TFT 900, except the bottom gate electrode 1006 is disposed above the buffer layer 904 and the bottom insulating layer 908 is disposed above and surrounding the bottom gate electrode 1006. In contrast to TFT 900, TFT 1000 includes connections between the top gate electrode 914 and the bottom gate electrode 1006 through paths 924 and 1026, which are coupled to gate voltage. Relative to switching TFT 900, switching TFT 1000 performed better in a GOA circuit having better Vth uniformity, better stability, and higher on current for high frequency and high speed operation. Relative to switching TFT 900, switching TFT 1000 performed better in a pixel circuit having better Vth uniformity, and better electrical stability under a positive bias temperature stress (PBTS) or a negative bias temperature stress (NBTS).

Figure 11:
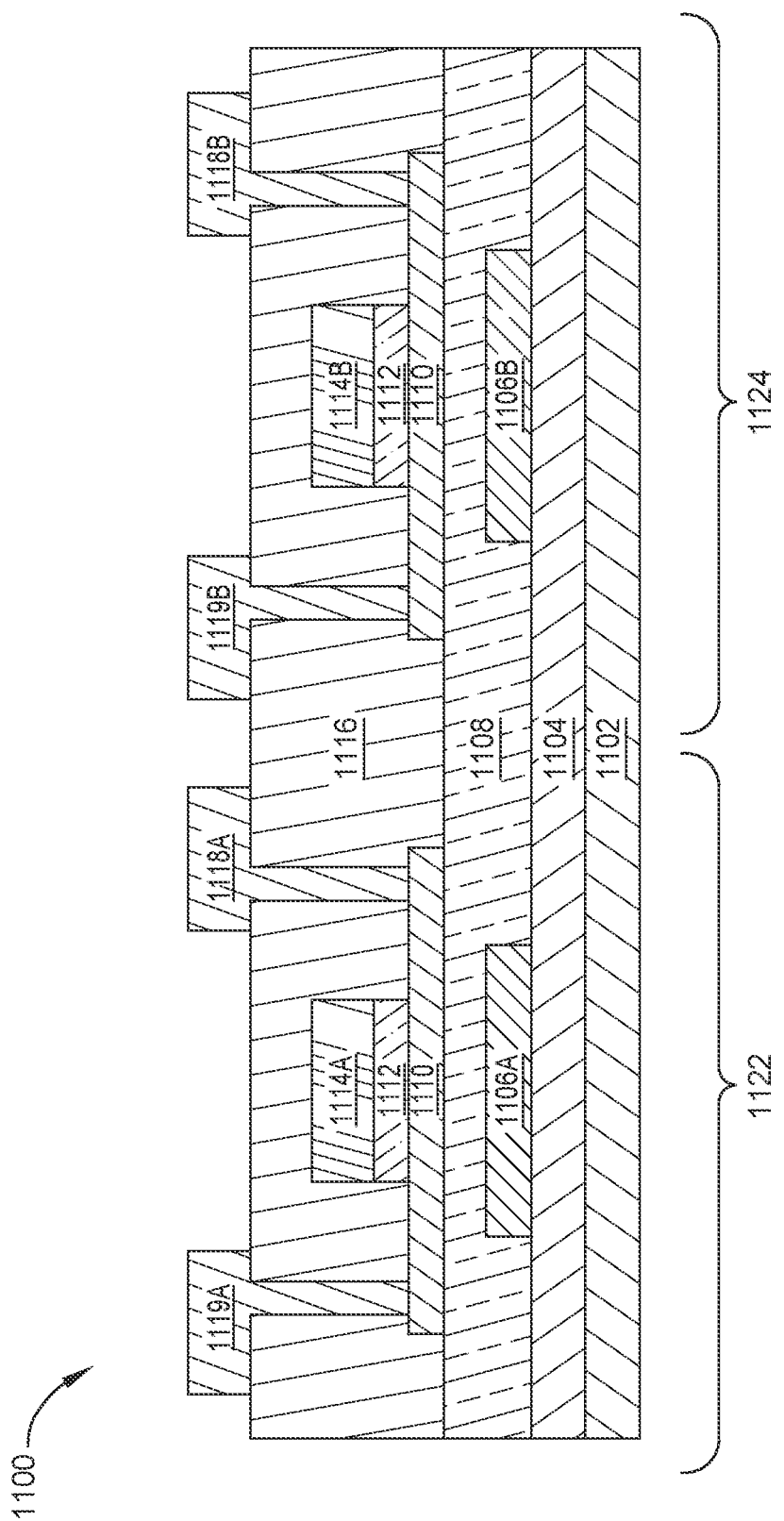
FIG. 11 depicts a driving transistor and a switching transistor disposed on the same substrate, in accordance with some embodiments.

FIG. 11 depicts an example of a transistor 1100 including a driving transistor 1122 and a switching transistor 1124 disposed on the same substrate 1102. Each TFT includes a buffer layer 1104, a gate insulating layer (or insulating layer) 1108, a channel structure 1110, a top gate insulating layer 1112, and ILD layer 1116. Each TFT includes source electrodes 1119A, 1119B, and drain electrodes 1118A, 1118B. Although a single TFT driving TFT is depicted, the driving transistor 1122 can be any of the driving transistors depicted in FIGS. 5A, 5B, 6-8, such as TFT 500A, TFT 500B, TFT 600, TFT 700, or TFT 800. In some aspects the driving transistor 1122 is a double gate TFT having bottom gate electrode 1106A and top gate electrode 1114A. Although a double gate TFT is depicted, as shown by bottom gate electrode 1106B and top gate electrode 1114B, the switching transistor 1124 can be a top gate transistor, such as TFT 900 or a double gate transistor, such as TFT 1000.

EXAMPLES

Transistors, such as the transistors described herein were formed using a dual layer channel structure composed of In—Zn—O on the bottom layer and In—Ga—Zn—O on the upper layer. The channel structure had a width of 40 µm and a length of 10 µm.

FIG. 12 depicts a graphical illustration 1200 of drain-to-source current (Ids) over gate-to-source voltage behavior comparison of transistors, and certain properties are also summarized in Table 1 below. In particular, the graph depicts log scale drain-to-source current $\log(I_{DS})$ over gate-to-source voltage (Vgs) for each TFT described with reference to FIG. 10 (TFT 1000), FIG. 6 (TFT 600), FIG. 5A (TFT 500A), and FIG. 9 (TFT 900). FIG. 12 shows the transfer curves at 1V drain voltage (Vds) with a small range of gate voltages from −1V to +5V to compare sub-threshold slopes (SS) from each transfer curve of each TFTs. Although not depicted in the Figures, 10V drain voltage data was also collected in Table 1. Here, the TFTs are operated in linear regime with 1V drain-to-source voltage (Vds) and in saturation regime at 10V drain-to-source voltage (Vds). The values of sub-threshold voltage vary with the value of drain-to-source voltage (Vds). Typically, large sub-threshold values are obtained from high drain voltage values. For example, Vds=10V produces a higher sub-threshold value relative to a sub-threshold value for lower drain-to-source voltages, such as Vds=1V. It has been found that switching transistors are operated in the linear regime with low value of the drain voltage (Vgs−Vth>Vds, Vgs>Vth) and driving transistors are operated in saturation regime with high drain voltage values (Vgs−Vth<Vds, Vgs>Vth). Here, Vgs is gate-to-source voltage, Vds is drain-to-source voltage, Vth is threshold voltage.

The region for each curve defined by a range between a low level of current 1E-11 to a high level of current 1E-7 amperes (A) was compared for each curve and a sub-threshold slope (SS) value was obtained. It has been found that transistors having small sub-threshold values (SS) are useful as switching transistors to quickly reach high level of drain current value (Ids) for fast switching operation. In contrast, transistors having large sub-threshold slope values (SS) are useful as driving transistors to slowly reach to high level of drain current value (Ids) for better control of a gray scale gate voltage with wider range of gate voltages between low level (1E-11) and high level (1E-7) drain current values.

In FIG. 12, the current range was selected for illustrative purposes and can correspond to the current from a driving transistor which can pass through an OLED display for the control of a gray scale gate voltage for the driving transistor as well as OLED display brightness. Large sub-threshold slope (SS) values are useful for better control of the gray scale. Drain-to-source current of 1E-11 A, which is identified by a horizontal broken line in FIG. 12, is an example of a current to turn off a TFT to get a black image in OLED display and 1E-7 A is an example of a current maximum to allow maximum brightness in OLED display. Other current values can be used depending on the application and display. Intermediate current ranges in between 1E-11 and 1E-7 can be selected to control certain levels of the brightness in OLED display using certain levels of gate voltages between gate voltage for 1E-11 and gate voltage for 1E-7 in the driving TFT. For example, the gate voltages can be divided into 256 "levels" used for control of attributes such as brightness.

Region 1202 identified in FIG. 12 corresponds to TFT 1000, region 1204 corresponds to TFT 600, region 1206 corresponds to TFT 500A, and region 1208 corresponds TFT 900. The width (ΔV) of the regions are indicative of ability to control voltage within the desired current range. As can be seen in the comparison of regions in FIG. 12 and ΔV in Table 1, region 1206 corresponding to TFT 500A is the widest and thus, demonstrates good control of gray scale gate voltage for driving transistors. This can also be quantitatively expressed in measuring an inverse slope of the curve in the region as shown below (e.g., subthreshold slope having units of V/decade). The values for each TFT is summarized below for drain voltage equal to 1V and the values in parentheses for Vd equal to 10V. TFT 500A showed the highest SS values for each voltage, which is indicative of enhanced ability to control voltage and current in driving TFT and thus increased control of display images. Thus, the transistors having high SS values, such as TFT 500A followed by TFT 600 perform well as driving transistors in pixel circuits. It has been discovered that electron mobility of the channel layer along with forming connections between certain electrodes can be optimized to form a TFT having predetermined SS values. In particular, each of the transistors summarized in Table 1 have the same channel layer composition and dimensions, however, TFT 500A has the lowest electron mobility u (cm2/Vs). Low electron mobility from TFT 500A performs well and enables good control for driving transistors with a high sub-threshold slope (SS) value relative to TFT 600, TFT 1000, and TFT 900.

In contrast, for switching transistors, a low SS value is such as TFT 1000, followed by TFT 900 perform well for switching transistors in GOA and pixel circuits. High electron mobility with a low SS value is preferred for switching TFT. It has been discovered, that the same channel layer composition can be used to provide a switching transistor having high electron mobility with a low SS value (ex. TFT 1000) and an adjacent driving transistor disposed on the same substrate having lower electron mobility with a high SS value (ex. TFT 500A).

TABLE 1

Electrical properties of each TFT described with reference to FIG. 10 (TFT 1000), FIG. 6 (TFT 600), FIG. 5A (TFT 500A), and FIG. 9 (TFT 900) with the same dual channel structure, In—Zn—O/In—Ga—Zn—O, by positioning In—Ga—Zn—O channel layer as an upper layer on the top of In—Zn—O channel layer as a bottom layer.

| TFT Properties | TFT 1000 | TFT 600 | TFT 500A | TFT 900 |
|---|---|---|---|---|
| Sub-threshold slope (SS) Vd = 1 V (10 V) | 0.10 (0.16) | 0.30 (0.30) | 0.32 (0.49) | 0.13 (0.17) |
| μ (cm2/Vs) | 40.3 | 35.9 | 27.1 | 38.5 |
| ΔV for gray scale (V) (1E−11 → 1E−7) | ~1.3 | ~2.2 | ~3.0 | ~1.7 |

Similar results as shown in Table 2 and Table 3 were found in comparisons of TFTs having other channel compositions, such as a dual layer channel structure (IZO/IGZTO) by positioning In—Ga—Zn—Sn—O as an upper layer on the top of In—Zn—O as a bottom channel layer and a single layer channel structure (IZO). Therefore, the TFTs (TFT 500A, TFT 600, TFT 900, TFT 1000) can show similar results regardless of channel structures showing the highest sub-threshold value and ΔV for better gray scale from TFT 500A and the lowest sub-threshold value and ΔV for fast switching from TFT 1000.

TABLE 2

Electrical properties of each TFT described with reference to FIG. 10 (TFT 1000), FIG. 6 (TFT 600), FIG. 5A (TFT 500A), and FIG. 9 (TFT 900) with the same dual channel structure, In—Zn—O/In—Ga—Zn—Sn—O, by positioning In—Ga—Zn—O channel layer as an upper layer on the top of In—Zn—O channel layer as a bottom layer.

| TFT Properties | TFT 1000 | TFT 600 | TFT 500A | TFT 900 |
|---|---|---|---|---|
| Sub-threshold slope (SS) Vd = 1 V (10 V) | 0.10 (0.14) | 0.14 (0.18) | 0.24 (0.26) | 0.14 (0.20) |
| μ (cm2/Vs) | 44.2 | 41.5 | 28.6 | 40.7 |
| ΔV for gray scale (V) (1E−11 → 1E−7) | ~0.8 | ~1.25 | ~2.3 | ~1.0 |

TABLE 3

Electrical properties of each TFT described with reference to FIG. 10 (TFT 1000), FIG. 6 (TFT 600), FIG. 5A (TFT 500A), and FIG. 9 (TFT 900) with the same single channel structure, In—Zn—O.

| TFT Properties | TFT 1000 | TFT 600 | TFT 500A | TFT 900 |
|---|---|---|---|---|
| Sub-threshold slope (SS) Vd = 1 V (10 V) | 0.12 (0.16) | 0.19 (0.22) | 0.18 (0.32) | 0.14 (0.19) |
| μ (cm2/Vs) | 47.1 | 40.0 | 31.9 | 45.0 |
| ΔV for gray scale (V) (1E−11 → 1E−7) | ~0.8 | ~1.2 | ~2.5 | ~0.9 |

Figure 13A:
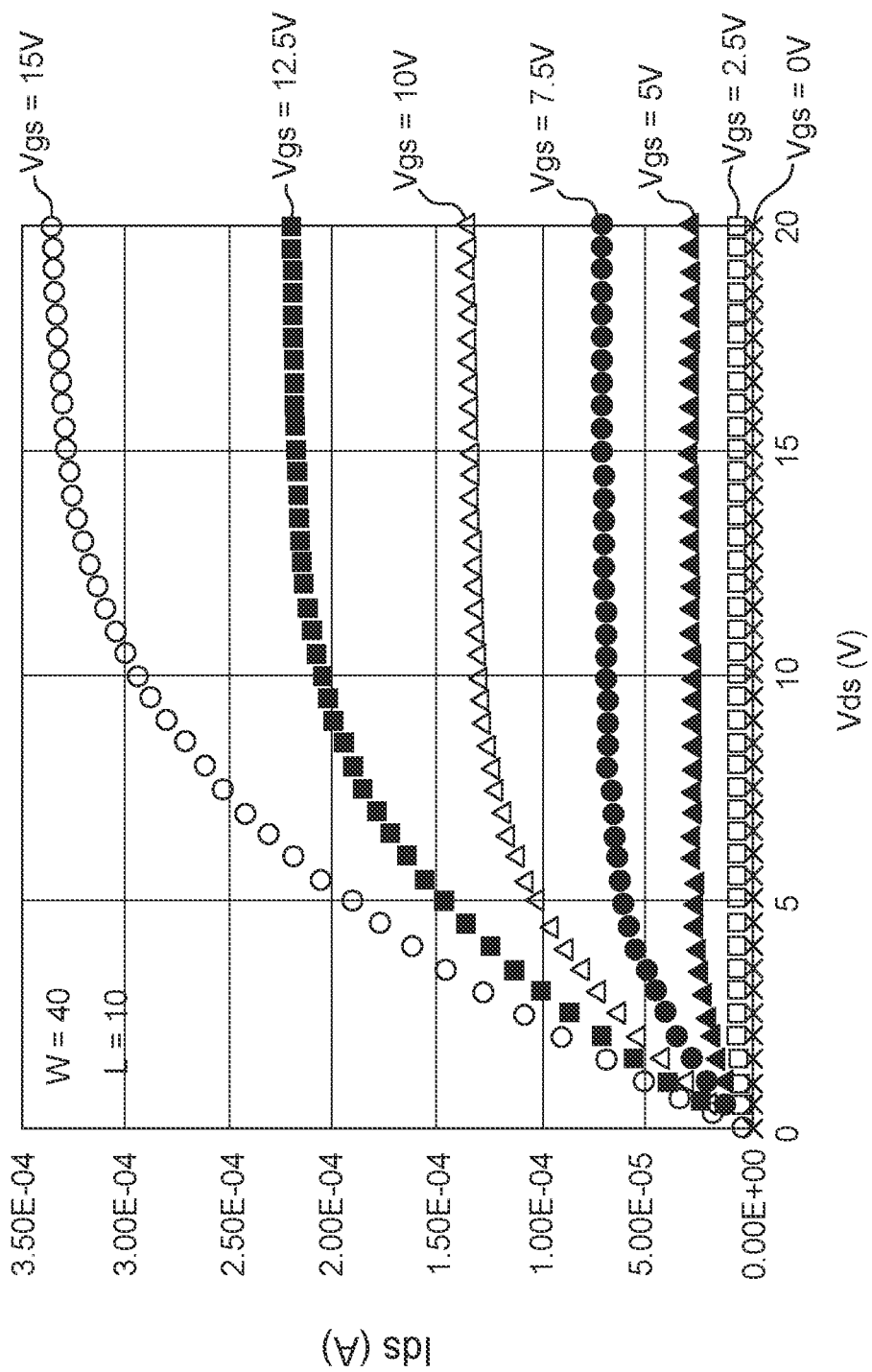
FIG. 13A depicts graphical illustration of output curves for a switching transistor, in accordance with some embodiments.
Figure 13B:
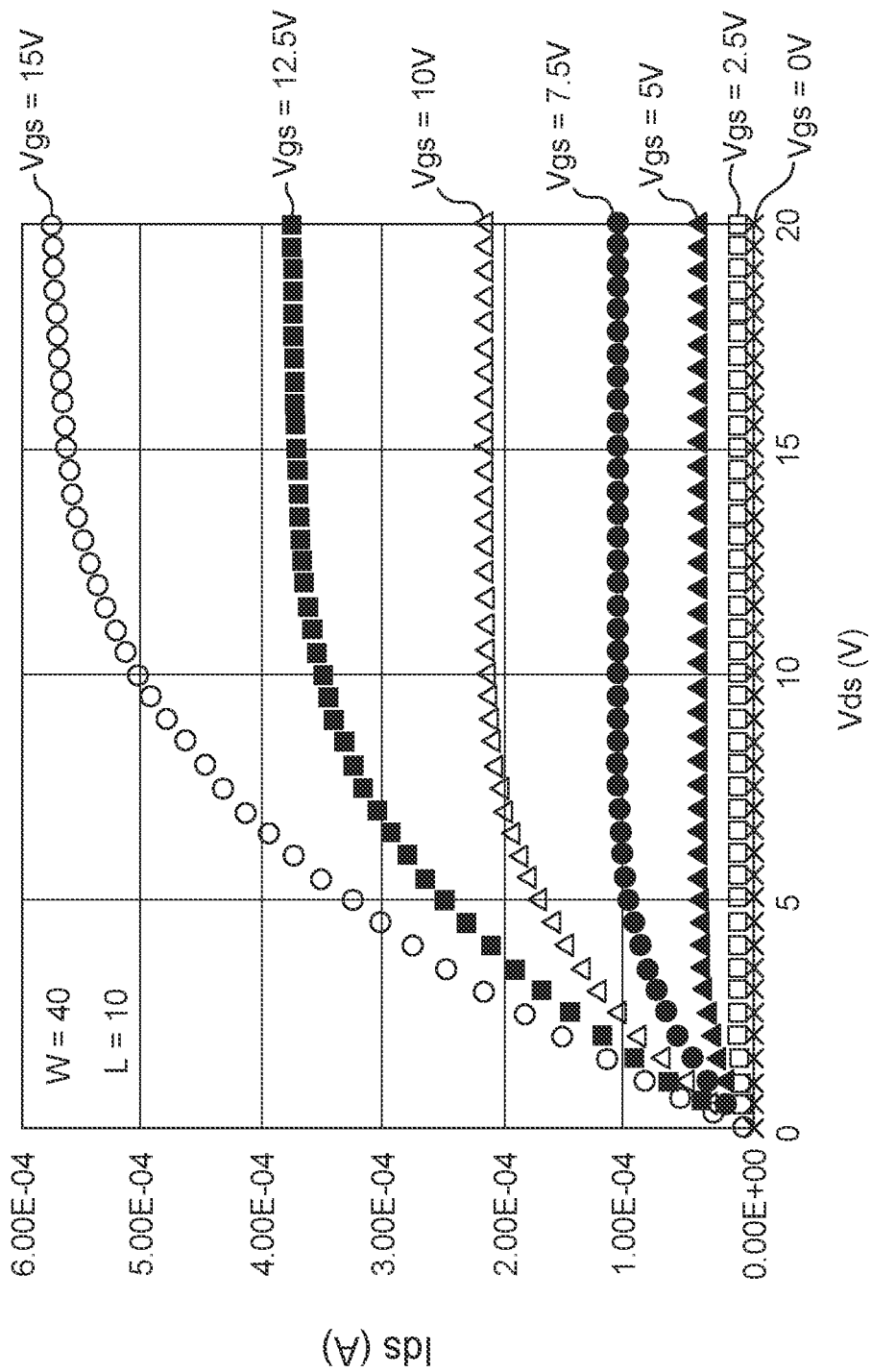
FIG. 13B depict a graphical illustration of output curves for a switching transistor, in accordance with some embodiments.
Figure 14A:
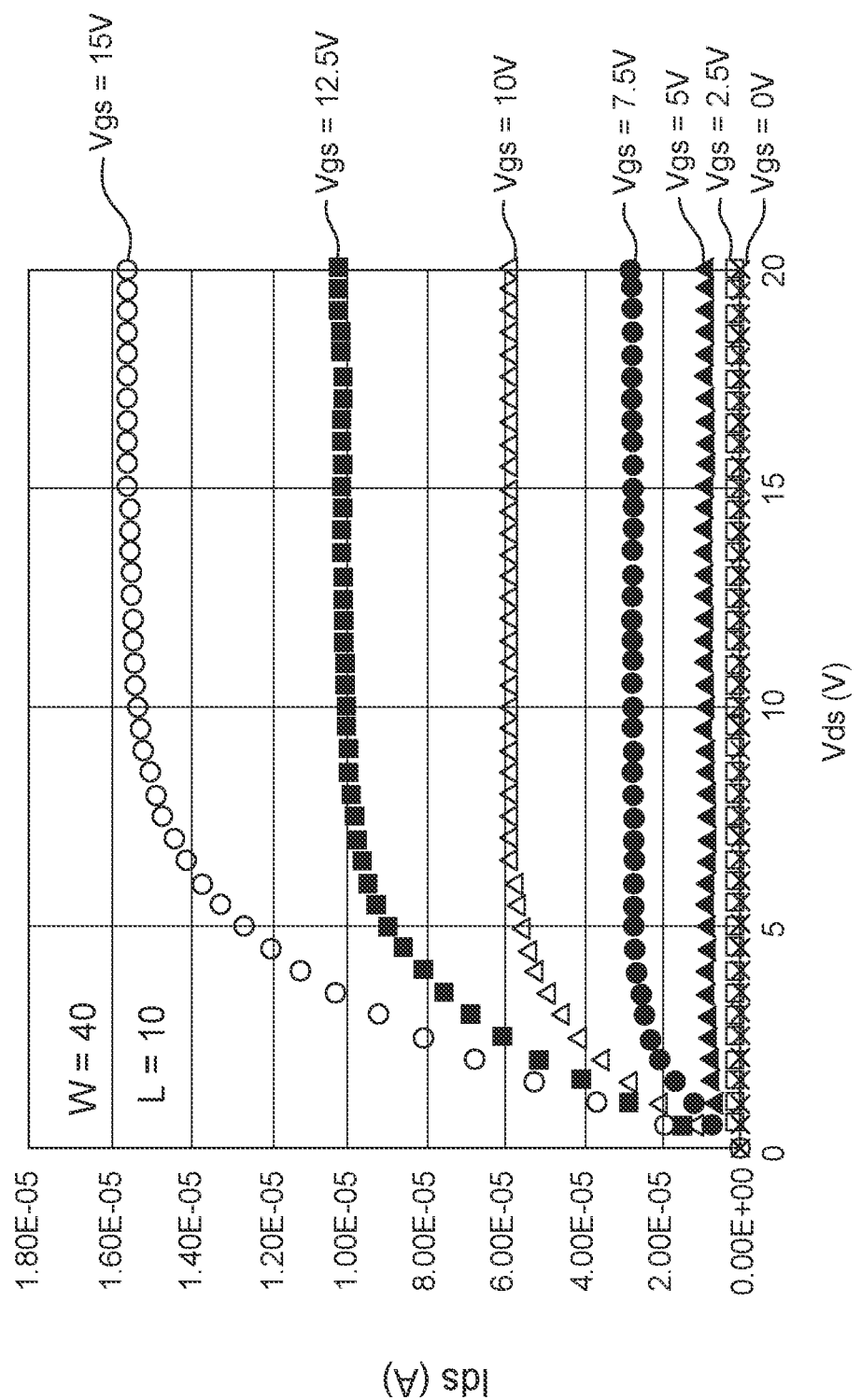
FIG. 14A depicts a graphical illustration of output curves for driving transistors, in accordance with some embodiments.
Figure 14B:
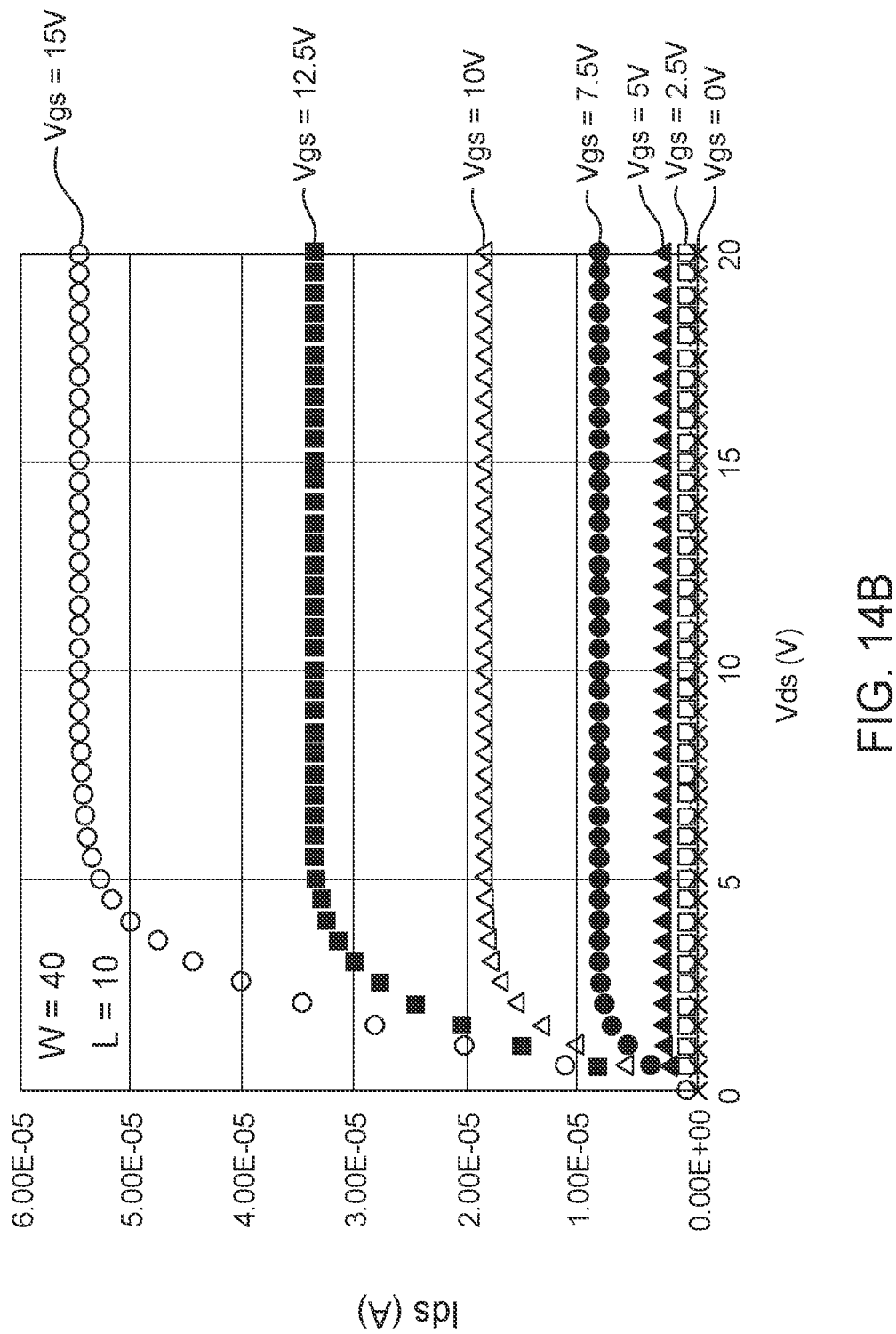
FIG. 14B depicts a graphical illustration of output curves for driving transistors, in accordance with some embodiments.

FIGS. 13A, 13B, 14A, and 14B depict graphical illustrations of output characteristics of transistors, in accordance with some embodiments. FIG. 13A depicts curves for TFT 900, FIG. 13B depicts curves for TFT 1000, FIG. 14A depicts curves for TFT 600, and FIG. 14B depicts curves for TFT 500A. To compare the performance of TFTs as switching or driving transistors, drain-to-source current (Ids) from TFTs were monitored at a gate-to-source voltage (Vgs) from 0V to 15V with voltage step of 2.5V and at a drain-to-source voltage (Vgs) from 0V to 20V with voltage step of 0.5V. Drain-to-source voltage (Vds) is represented in the horizontal axis and drain-to-source current (Ids) is represented by the vertical axis. TFT 1000 as shown in FIG. 13B performs well as a switching transistor for fast switching operation due to higher drain-to-source current (Ids) and lower sub-threshold slope (SS) value relative to TFT 900, TFT 600, and TFT 500A as shown FIGS. 13A, 14A, and 14B. However, TFT 600 and TFT 500A as shown in FIGS. 14A, and 14B, perform well as driving transistors for better control of gray scale because the drain-to-source current (Ids) do not show notable variations with changes to drain-to-source voltage (Vds) in saturation regime and the drain-to-source current is quickly saturated to designated target current at low drain-to-source voltage (Ids) compared to TFT 900 and TFT 1000 as shown in FIGS. 13A, and 13B. Therefore, the saturation region from TFT 500A and TFT 600 is broader than TFT 900 and TFT 1000 which provide good output saturation. Moreover, there is less sensitivity of drain-to-source current by changing drain-to-source voltage in saturation regime, which allows precise control of drain-to-source current (Ids) as a driving TFT for better OLED uniformity. In addition, TFT 500A as shown in FIG. 14B allows better control of gray scale as a driving transistor due to higher sub-threshold slope (SS) value relative to TFT 600 as shown in FIG. 14B.

Although FIGS. 12-14B and Tables 1-3 do not show data from TFT 700 depicted in FIG. 7, it has been found that TFT 700 showed similar results as TFT 600, except Vth tuning with DC voltage is not used in TFT 700. Moreover, FIGS. 12-14B and Tables 1-3 do not show data from TFT 800 depicted in FIG. 8, however, TFT 800 showed similar results as TFT 500A, except Vth tuning with DC voltage is not used in TFT 800. Additionally, although FIGS. 12-14B and Tables 1-3 depict transistors with metal oxide channels, other channels are also contemplated such as LTPS single layer channels. LTPS transistors have been discovered to have similar relative results as the MO channel structures.

In summation, transistors are provided herein providing positive threshold voltage (e.g., turn on voltage) close to 0 V, higher on-current, such as for switching TFTs, and good voltage/gray color control with low sub-threshold slope value and good output saturation curve with gate-to-source voltage less dependent of drain-to-source voltage changes, such as in driving TFT for OLED displays.

These and other advantages may be realized in accordance with the specific embodiments described as well as other variations. It is to be understood that the above description is intended to be illustrative, and not restrictive. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the following claims, the terms "first," "second," and "third," etc. are used merely as labels, and are not intended to impose numerical requirements on their objects.

As used herein, the term "about" refers to a +/−10% variation from the nominal value. It is to be understood that such a variation can be included in any value provided herein.

What is claimed is:

1. A device comprising:
   a pixel circuit, the pixel circuit comprising:
      a driving thin film transistor (TFT), the driving TFT comprising:
         a driving channel;
         an inter layer dielectric (ILD) layer disposed over the driving channel;
         a driving source electrode disposed through the ILD layer to contact an upper surface of the driving channel, the driving source electrode coupled to a source voltage via a source electrode path of wiring; and
         a driving top gate electrode disposed above the driving channel and electrically connected to the driving source electrode and the source voltage via a top gate electrode path of wiring coupled to the source electrode path; and
      a first switching TFT connected to a scan line; and
   a gate on array (GOA) circuit, the GOA circuit comprising a second switching TFT and a third switching TFT, wherein the second switching TFT and the third switching TFT are connected to the scan line.

2. The device of claim 1, wherein each of the switching TFTs comprise:
   a switching metal oxide (MO) channel; and
   a switching top gate electrode disposed above the switching MO channel.

3. The device of claim 2, wherein at least one of the switching TFTs comprise a switching bottom gate electrode electrically connected to the switching top gate electrode.

4. The device of claim 1, wherein the driving TFT further comprises a driving bottom gate electrode, wherein a gate bias is applied to the driving bottom gate electrode.

5. A device comprising a driving thin film transistor (TFT) comprising:
   a first TFT comprising:
      a first channel,
      a first bottom gate electrode disposed below the first channel, and
      a gate insulator layer disposed between the first channel and the first bottom gate electrode, and
   a second TFT adjacent to the first TFT comprising:
      a second channel, and
      a second bottom gate electrode disposed below the second channel and electrically connected to the first bottom gate electrode of the first TFT, wherein
      the gate insulator layer extends from the first TFT and is disposed between the second channel and the second bottom gate electrode and the first bottom gate electrode and the second bottom gate electrode are electrically connected to the same voltage source.

6. The device of claim 5, wherein the first TFT comprises a first top gate electrode disposed above the first channel.

7. The device of claim 5, further comprising one or more switching TFTs, each switching TFT is a top gate electrode TFT, wherein the top gate electrode TFT is free of bottom gate electrodes.

8. The device of claim 5, further comprising one or more switching TFTs, each switching TFT comprising:
   a switching bottom gate electrode;
   a switching metal oxide (MO) channel disposed above the switching bottom gate electrode; and
   a switching top gate electrode disposed above the switching MO channel, wherein the switching top gate electrode is electrically connected to the switching bottom gate electrode.

9. The device of claim 8, wherein the device comprises a gate driver on array (GOA) circuit.

10. The device of claim 8, wherein the device comprises a pixel circuit.

11. The device of claim 5 further comprising a top gate insulating layer disposed over the first channel and extending over the second channel.

12. The device of claim 5, further comprising a first top gate insulating layer disposed over the first channel and a second top gate insulating layer disposed over the second channel.

13. A device comprising a driving thin film transistor (TFT) comprising:
   a first TFT comprising:
      a first channel,
      a gate insulator layer disposed below the first channel, and
      a first top gate electrode disposed above the first channel; and
   a second TFT adjacent to the first TFT comprising:
      a second channel,
      the gate insulator layer disposed below the second channel, and
      a second top gate electrode disposed above the second channel and electrically connected to the first top gate electrode of the first TFT, wherein
      the gate insulator layer extends from the first TFT and is disposed between the second channel and the second bottom gate electrode and the first top gate electrode and the second top gate electrode are electrically connected to the same voltage source.

14. The device of claim 13, further comprising one or more switching TFTs, each switching TFT comprising:
   a switching channel; and
   a switching top gate electrode disposed above the switching channel.

15. The device of claim 14, further comprising one or more switching TFTs, each switching TFT comprising a switching bottom gate electrode disposed below the switching channel, wherein the switching top gate electrode is electrically connected to the switching bottom gate electrode.

16. The device of claim 13, wherein at least one of the first channel and the second channel is a metal oxide containing layer comprising at least one of indium, zinc, gallium, oxygen, aluminum, tin, In—Zn—O, In—Sn—O, In—Zn—Sn—O, In—Ga—O, In—Ga—Zn—O, In—Ga—Sn—O, In—Ga—Zn—Sn—O, or a combination thereof.

17. The device of claim 13, wherein at least one of the first channel and the second channel is a low temperature poly silicon (LTPS) single layer.

18. The device of claim 13, wherein at least one of the first channel or the second channel, or both the first and second channel each consist of a single layer.

19. The device of claim 13, wherein at least one of the first channel or the second channel comprise two or more layers, each layer having different electron mobility.

20. The device of claim 1, wherein the ILD layer extends across an upper surface of the driving top gate electrode.

* * * * *

UNITED STATES PATENT AND TRADEMARK OFFICE
CERTIFICATE OF CORRECTION

PATENT NO. : 12,354,557 B2  
APPLICATION NO. : 18/556460  
DATED : July 8, 2025  
INVENTOR(S) : Dong Kil Yim et al.

Page 1 of 2

It is certified that error appears in the above-identified patent and that said Letters Patent is hereby corrected as shown below:

In the Specification

In Column 4, Line 14, delete "2901," and insert -- $290_1$, --.

In Column 4, Line 15, delete "2902," and insert -- $290_2$, --.

In Column 4, Line 15, delete "2903," and insert -- $290_3$, --.

In Column 4, Line 18, delete "2901" and insert -- $290_1$ --.

In Column 4, Line 18, delete "2501A," and insert -- $250_{1A}$, --.

In Column 4, Line 19, delete "2501B" and insert -- $250_{1B}$ --.

In Column 4, Line 19, delete "$2501_C$." and insert -- $250_{1C}$. --.

In Column 4, Line 21, delete "2901" and insert -- $290_1$ --.

In Column 4, Line 22, delete "2501N" and insert -- $250_{1N}$ --.

In Column 4, Line 24, delete "2901." and insert -- $290_1$. --.

In Column 4, Line 28, delete "2501A" and insert -- $250_{1A}$ --.

In Column 4, Line 29, delete "2901" and insert -- $290_1$ --.

In Column 4, Line 59, delete "2501A." and insert -- $250_{1A}$. --.

Signed and Sealed this  
Third Day of February, 2026

John A. Squires  
*Director of the United States Patent and Trademark Office*

CERTIFICATE OF CORRECTION (continued)
U.S. Pat. No. 12,354,557 B2

In Column 4, Line 61, delete "2501A," and insert -- $250_{1A}$, --.

In Column 11, Line 5, delete "u" and insert -- µ --.